United States Patent [19]

Tanaka et al.

[11] Patent Number: 4,947,229
[45] Date of Patent: Aug. 7, 1990

[54] SEMICONDUCTOR INTEGRATED CIRCUIT

[75] Inventors: Yutaka Tanaka, Yokohama; Toshiki Morimoto, Kawasaki; Seiji Watanabe, Yokohama, all of Japan

[73] Assignee: Kabushiki Kaisha Toshiba, Kawasaki, Japan

[21] Appl. No.: 123,969

[22] Filed: Nov. 23, 1987

[30] Foreign Application Priority Data

Jan. 9, 1987 [JP] Japan .................................. 62-2977

[51] Int. Cl.⁵ .................. H01L 23/535; H01L 27/118
[52] U.S. Cl. ........................................ 357/45; 357/68; 357/71
[58] Field of Search .................... 357/45, 45 M, 71, 68

[56] References Cited

U.S. PATENT DOCUMENTS

| | | | |
|---|---|---|---|
| 4,661,815 | 4/1987 | Takayama et al. | 357/45 |
| 4,780,846 | 10/1988 | Tanabe et al. | 357/45 |
| 4,833,520 | 5/1989 | Ito et al. | 357/45 |
| 4,870,300 | 9/1989 | Nakaya et al. | 357/45 |

FOREIGN PATENT DOCUMENTS

| | | | |
|---|---|---|---|
| 58-51537 | 3/1983 | Japan | 357/45 M |
| 62-1248 | 1/1987 | Japan | 357/71 |

Primary Examiner—William D. Larkins
Attorney, Agent, or Firm—Finnegan, Henderson, Farabow, Garrett, and Dunner

[57] ABSTRACT

A semiconductor integrated circuit (IC) comprises a functional block which includes a plurality or first and second power source wiring layers arranged parallel to one another and formed so as to extend in a predetermined direction. A plurality of element regions are located between adjacent pairs of the first and second power source wiring layers. A cell block on the (IC) includes a plurality of cell column areas each having third and fourth power source wiring layers which are arranged parallel to each other and formed so as to extend in the predetermined direction. An element region is located between the third and fourth power source wiring layers. A plurality of wiring regions are located between adjacent cell column areas. A wiring interconnection section is also included for connecting the first and second power source wiring layers to the function block and includes a fifth power source wiring layer of double-layered structure having upper and lower layers respectively connected to the first and second power source wiring layers. The wiring interconnection section includes first and second segments which are also formed to extend in the predetermined direction, so as to connect the lower and upper layers of the fifth power source wiring layer to the third and fourth power source wiring layers.

6 Claims, 6 Drawing Sheets

SEMICONDUCTOR INTEGRATED CIRCUIT

BACKGROUND OF THE INVENTION

This invention relates to a standard cell type semiconductor integrated circuit having function and cell blocks.

Figure 1:
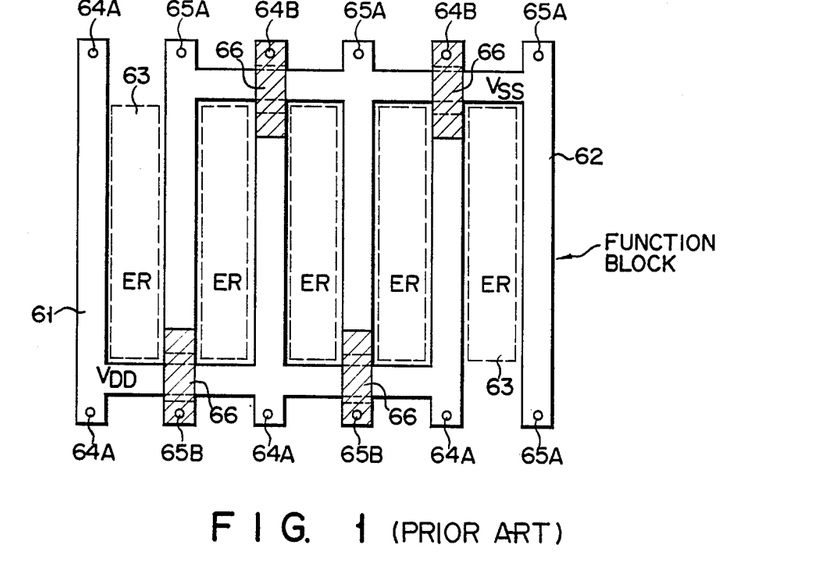
FIG. 1 shows the arrangement of the function block of the prior art semiconductor integrated circuit.

In general, standard cell type LSIs are advantageously used for forming semicustom-built LSIs. When, for example, a function block such as RAM or ROM having a data storing function, or a multiplier having a calculating function is formed on an LSI chip, it is formed in such a pattern as is shown in FIG. 1. That is, the function block includes VDD power source wiring layer 61 and VSS power source wiring layer 62 which are each formed of aluminum, as first or lower wiring layers, in a comb-like shape, with their tooth portions alternately arranged. Element regions (ER) 63 are defined by the adjacent tooth portions of wiring layers 61 and 62. In order to connect wiring layers 61 and 62 of the function block to power source wiring layers of a cell block adjacent to the function block, some tooth portions are extended to form power source nodes such as VDD nodes 64A and VSS nodes 65A, and the remaining tooth portions are electrically coupled, via second or upper wiring layers 66, to power source connection nodes 64B and 65B which are formed of the first wiring layers in positions facing the remaining tooth portions.

Figure 2:
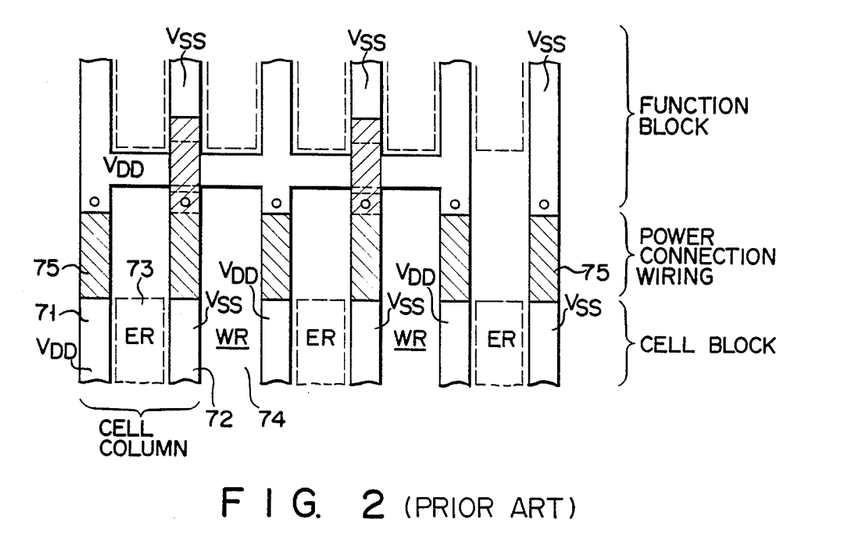
FIGS. 2 and 3 both show the connection relation between the function block of FIG. 1 and a cell block.

FIG. 2 shows an example of the connection pattern connecting the power source wiring layers of the function block to the power source wiring layers of the cell block formed on the same chip. The cell block has a plurality of column areas each including a set made up of VDD wiring layer 71 VSS wiring layer 72, element region 73 located therebetween, and wiring regions (WR) 74 In the case where the width of wiring region 74 of the cell block is equal to that of element region 73, and the number of wiring layers 71 and 72 is equal to that of the wiring layers or the tooth portions of the function block, the VDD and VSS wiring layers of the cell block can be respectively connected to the VDD and VSS wiring layers of the function block via power source wiring connection layers constituted by lower layers 75. In this case, the VDD or VSS wiring layer of the cell and function blocks connected by connection layer 75 can be arranged in a straight line.

Figure 3:
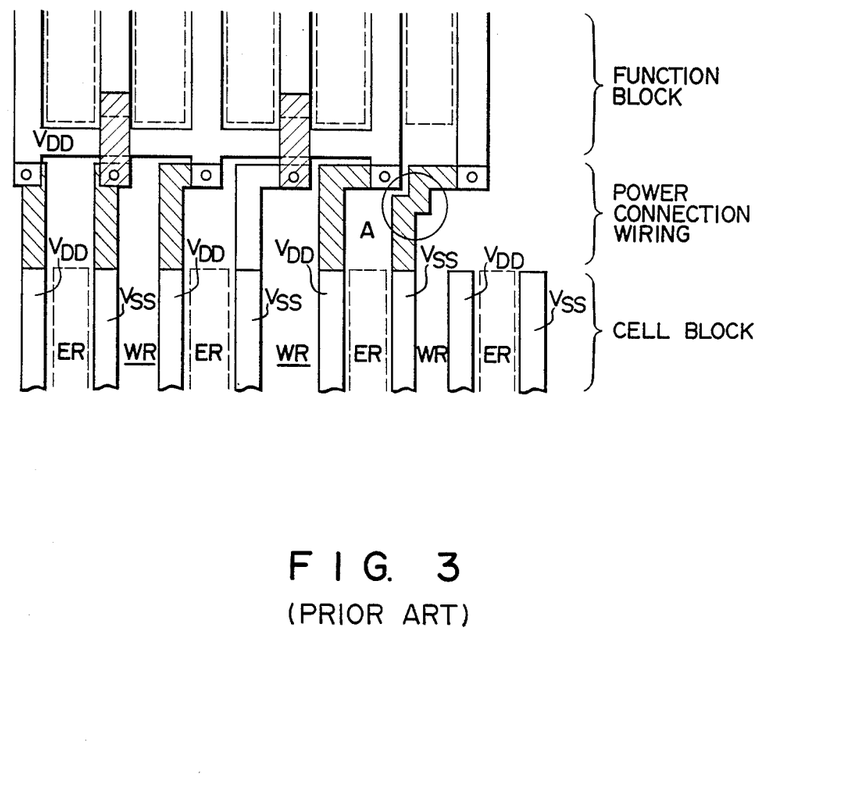

The width of wiring region 74 in the cell block may vary depending on the wiring pattern design, the number of the wiring layers in the cell block not always being equal to that of the wiring layers or comb tooth portions in the function block. Therefore, in the case where the width of wiring region 74 is reduced and the number of wiring layers in the cell block is increased, some cell column areas of the cell block cannot then be connected to the power source wiring layers of the function block, as is shown by the wiring pattern in FIG. 3. Further, part of power source wiring connection layer will extend into the signal wiring area, as is shown by portion A. A cell column area which cannot be connected to the function block is much less able to supply power source current as compared with the other cell column areas which are connected to the function block, with the result that standard cells in the former cell column area may operate erroneously. Further, when the power source wiring connection layer extends partly into the signal wiring area, as described before, the wiring efficiency will be lowered. When power source nodes 64A, 64B, 65A, and 65B are arranged at fixed positions on the function block, it may then become difficult to connect the function block and cell block to each other, on the same chip, by means of a simple form of power source wiring connection pattern. That is, with the positions of the power source nodes fixed, the form of the wiring connection pattern will likely become more complicated.

SUMMARY OF THE INVENTION

An object of this invention is to provide a semiconductor integrated circuit in which the function and cell blocks can be connected to each other without lowering the wiring efficiency, even when the number of power source wiring layers in the function block differs from that of the wiring layers in the cell block.

This object can be attained by a semiconductor integrated circuit comprising a functional block which includes a plurality of first and second power source wiring layers arranged substantially parallel to one another and formed so as to extend in a predetermined direction, a plurality of element regions each located between adjacent pairs of first and second power source wiring layers, and a third power source wiring layer of double layered structure having upper and lower layers respectively connected to the first and second power source wiring layers; a cell block including a plurality of cell column areas each having fourth and fifth power source wiring layers which are arranged parallel to each other and formed so as to extend in the predetermined direction, and an element region located between the fourth and fifth power source wiring layers, a plurality of wiring regions, each located between adjacent cell column areas; and first and second interconnection members also formed to extend in the aforementioned predetermined direction, to connect the lower and upper layers of the third power source wiring layer to the fourth and fifth power source wiring layers.

In the semiconductor integrated circuit of this invention, since the third power source wiring layer of the function layer includes upper and lower layers which can be connected to the fourth and fifth power source wiring layers, all the cell column areas of the cell block can be connected to the function block by means of a simple connection pattern, without the need to provide a plurality of power source nodes on the function block. This makes it possible to prevent erroneous operation of standard cells due to insufficient current supply to the cell block as well as preventing a reduction in the wiring efficiency of the signal wiring region between the cell and function blocks. As a result, the number of the cell column areas and the width of the wiring area between the cell column areas can be freely selected.

DETAILED DESCRIPTION OF THE PREFERRED EMBODIMENT

Figure 4:
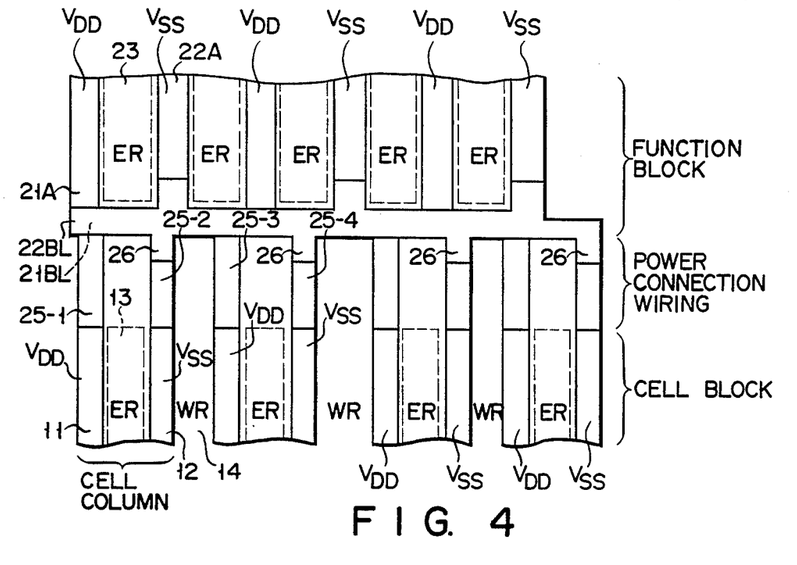
FIG. 4 shows the connection relation between the cell and function blocks of a semiconductor integrated circuit according to one embodiment of this invention.
Figure 5:
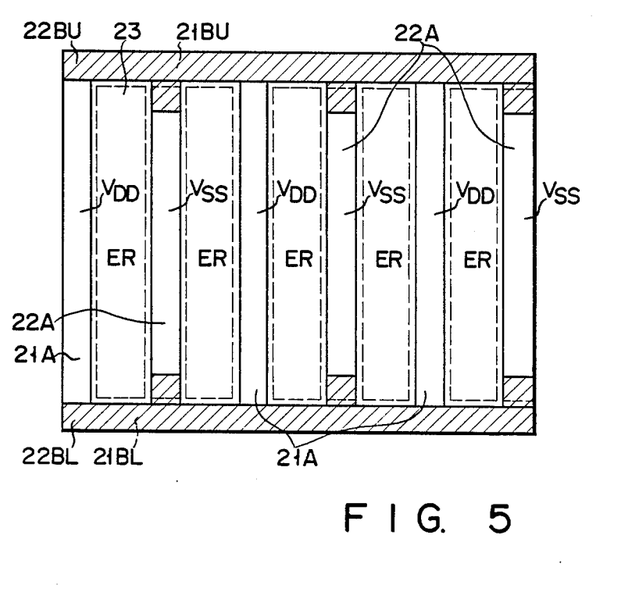
FIG. 5 shows the function block of FIG. 4 in more detail.
Figure 6:
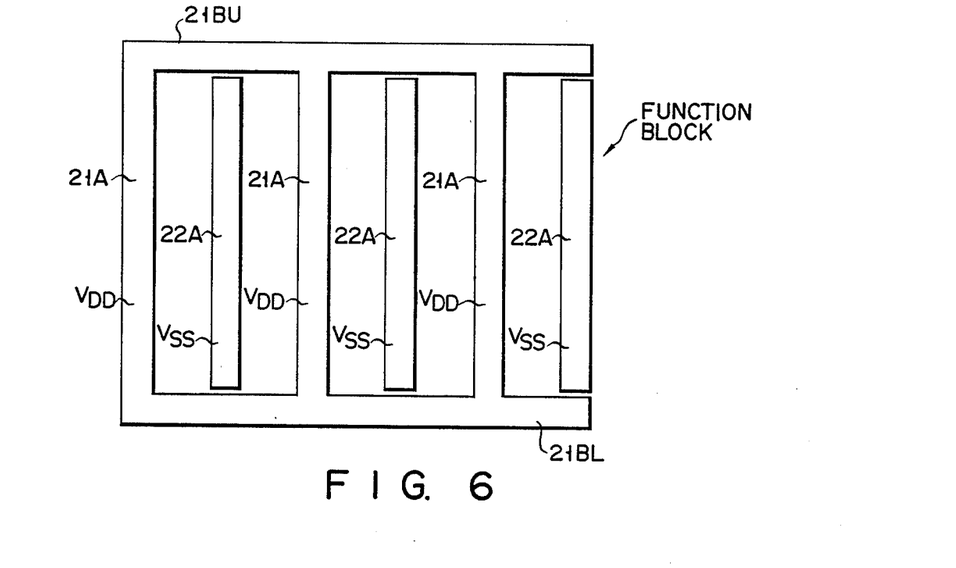
FIG. 6 shows the pattern of a lower wiring layer constituting the function block of FIG. 5.

An embodiment of this invention will now be described with reference to the drawings. FIG. 4 shows part of the pattern on a chip used in forming a standard cell type semicustom-built LSI. In this case, a cell block and a function block having the memory function are connected to each other by means of a power source interconnection member. The function block is constructed as shown in FIG. 5, for example. A VDD power source wiring layer is formed of a first or lower wiring layer composed of, for example, aluminum, in a ladder-like pattern. As is clearly shown in FIG. 6, the VDD power source wiring layer is made up of bar pattern sections 21A of the lower layer extending in a vertical direction, with upper and lower frame pattern sections 21BU and 21BL of the lower layer respectively connected to the upper and lower ends of bar pattern sections 21A and extending in a horizontal direction, thereby being formed in a ladder-like pattern. In contrast, the VSS power source wiring layer is formed with bar pattern sections 22A of the lower layer extending in a vertical direction and upper and lower frame pattern sections 22BU and 22BL or a second or upper wiring layer composed of, for example, aluminum, respectively connected to the upper and lower ends of bar pattern sections 22A and extending in a horizontal direction, whereby it too is formed in a ladder-like pattern. In other words, the lower layer is formed in such a pattern as is shown in FIG. 6, to constitute the VDD power source wiring layer and bar pattern sections 22A of the VSS power source wiring layer which are each placed between adjacent pairs of bar pattern sections 21A. The areas defined by bar pattern sections 21A and 22A are used as element regions 23. Frame pattern sections of 22BU and 22BL of the VSS power source wiring layer are respectively positioned over frame pattern sections 21BU and 21BL of the VDD power source wiring layer 21BU and 21BL with an insulation film (not shown) formed therebetween. Thus, the upper and lower frame pattern sections of the function block are respectively formed of power source wiring layers 21BU, 22BU and 21BL, 22BL in a double layered structure.

The cell block has a plurality of cell column areas each including a set made up of VDD power source wiring layer 11 and VSS power source wiring layer 12, which are formed to extend parallel to each other, with element (standard cell) region (ER) 13 being located therebetween. Those areas defined by adjacent pairs of cell column areas are used as wiring regions (WR) 14. The cell column areas are arranged so that they extend in a direction perpendicular to that of double-layered power source wiring layers 21BU, 22BU and 21BL, 22BL of the function block.

The cell and function blocks are connected to each other by means of power source interconnection pattern (or power connection wiring pattern) PCW. Power connection wiring pattern PCW includes first connection patterns 25-1, 25-2, ... of the first or lower layer and second connection patterns 26 of the second or upper layer. Half of the first connection patterns, for example, odd-numbered connection patterns 25-1, 25-3, ... are formed linearly, thereby to connect one of the power source wiring layers of each cell column area (for example, VDD power source wiring layer 11) to VDD power source wiring layer 21BL of the lower layer of double layered power source wiring layers 21BU, 22BU; and 21BL, 22BL of the function block. The remaining first connection patterns, i.e. the even-numbered connection patterns 25-2, 25-4, ... are formed integrally at one end, with the other of the power source wiring layers of each cell column area, i.e. VSS power source wiring layer 12, and are formed to extend linearly toward the function block, with their tip ends positioned near power source wiring layer 21BL of the lower layer. The tip ends of the even-numbered connection patterns are electrically connected, via a contact hole (not shown), to second connection patterns 26 which are formed integrally with power source wiring layer 21BL. Further, second connection patterns 26 extend linearly toward VSS power source wiring layers 12 so as to partly overlap the tip ends of the even-numbered connection patterns, with an insulation layer (not shown) formed therebetween.

Figure 7:
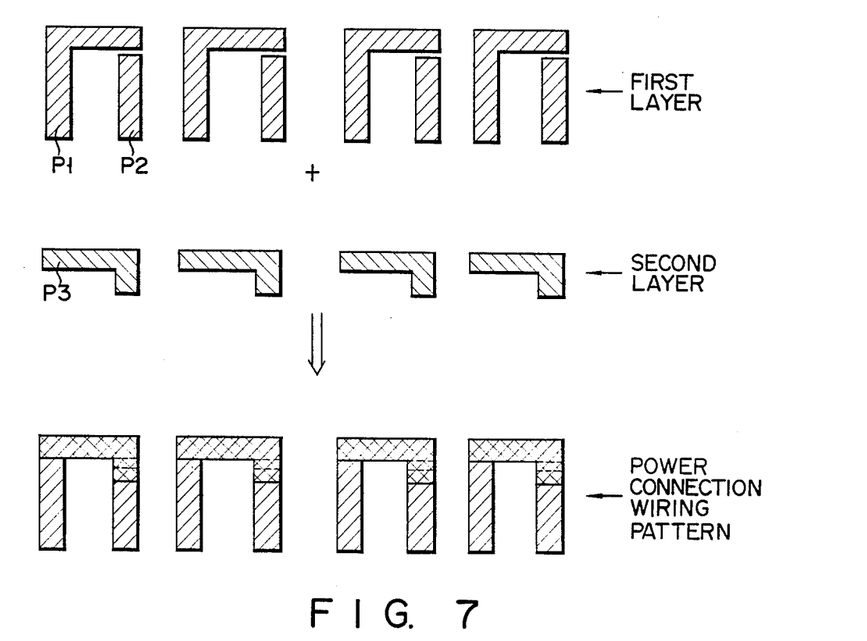
FIG. 7 shows a manufacturing process whereby upper and lower wiring layers are made to form part of the function block of FIG. 5.

In the case where the power connection wiring pattern is designed by use of a computer-aided design (CAD) system, three types of basic pattern—P1, P2, and P3, as shown in FIG. 7—are prepared, for example. In this case, those portions of the pattern, designed by use of the CAD system, which are electrically connected and formed of the same layer—for example, power source wiring layer 22BL and connection pattern 26—are formed integrally with each other.

With the function block having double layered power source wiring layers 21BU, 22BU; and 21BL, 22BL, the power source wiring layers 11 and 12 in each cell column area of the cell block can be connected to respective power source wiring layers 21A and 22A of the function block, via power connection wiring section PCW, by simply extending power source wiring layers 11 and 12. In this case, in power connection wiring section PCW, first connection patterns 25-1, 25-2, ... are formed so as to extend in a direction substantially perpendicular to power source wiring layer 21BL of the lower layer of the function block, and second connection patterns 26 are formed such that they extend in a direction substantially perpendicular to power source wiring layer 22BL of the upper layer. Therefore, if the relation between the width of the cell block and the length of power source wiring layers 21BL and 22BL of the function block has already been set, power source wiring layers 11 and 12 of all the cell column areas of the cell block can be connected to power source wiring layers 21A and 22A of the function block irrespective of whether or not the number of power source wiring layers 21A and 22A and the spacing between each of the power source wiring layers of the function block are respectively equal to the number of power source wiring layers 11 and 12 and the spacing between each of the power source wiring layers of the cell block. As a result, the supply, at all times, of a sufficiently large power source current to all the cell column areas in the cell block is assured, thus preventing the standard cells from operating erroneously due to a shortage of power source current. Further, power connection wiring section PCW is constituted by a combination of patterns which extend in a cell column direction, and will not extend into the normal signal wiring regions between the cell and function blocks, thus maintaining at a high level the wiring efficiency of the signal wiring regions.

The same effect as achieved in the above embodiment can also be achieved in the case where the VDD and VSS power source wiring layers are interchanged. In the above embodiment, the function block is connected at only one side to the cell block via the power connection wiring section. However, it is also possible to connect the cell blocks to both sides of the function block via respective power connection wiring sections, in the same manner as described above.

Figure 8:
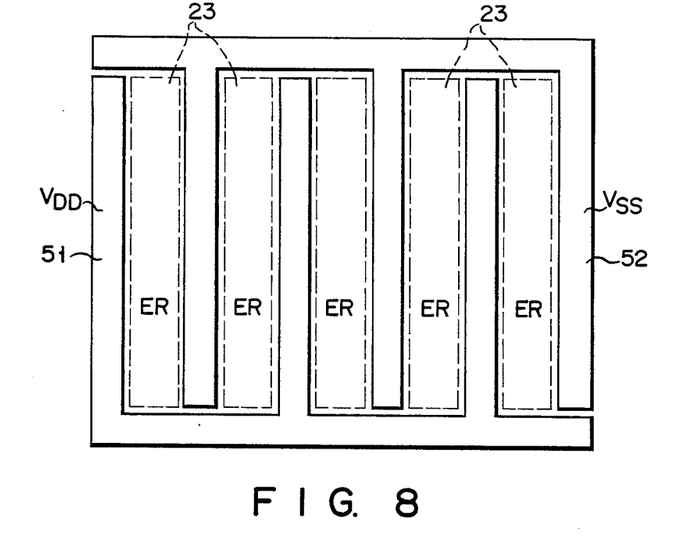
FIG. 8 is a modification of the function block shown in FIG. 5.
Figure 9:
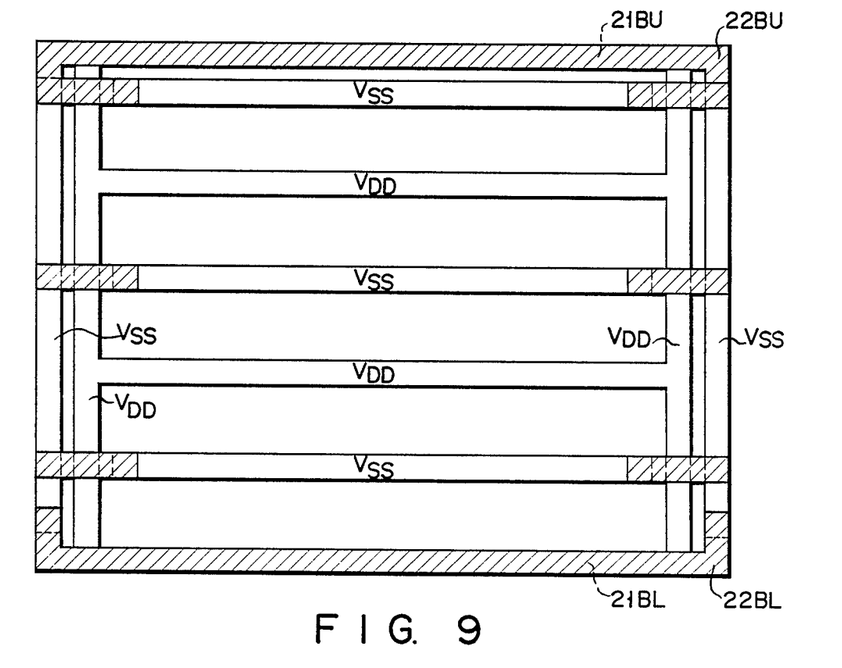
FIGS. 9 and 10 are both modifications of the function block shown in FIG. 5.
Figure 10:
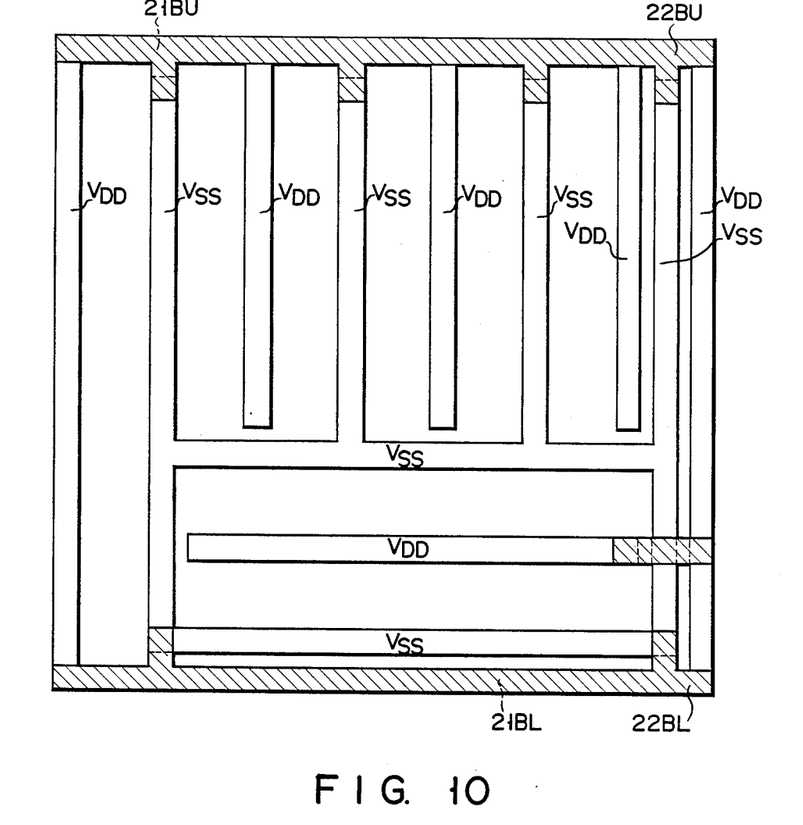

If, as is described above, the wiring section of the function block extending in a direction perpendicular to the column direction of the cell block is formed having a double-layered structure, then the internal power source wiring pattern can be freely selected. For example, the power source wiring pattern of the lower layer in the function block can be constituted by VDD wiring pattern 51 and VSS wiring pattern 52 which are each formed in a comb-like shape, as is shown in FIG. 8. Further, as is shown in FIG. 9, the internal power source wiring layers of the function block can be arranged in the same direction (in the horizontal direction in FIG. 9) as double-layered power source wiring layers 21BU, 21BL, and 22BU, 22BL. It is also possible to constitute the internal power source wiring layers of the function block by way of a combination of wiring layers extending in the same direction as the double-layered power source wiring layers, and wiring layers extending in a direction perpendicular thereto. In FIGS. 9 and 10, the hatched portion indicates the upper wiring layer, and other wiring portion indicates the lower wiring layer. The internal power source wiring layers can be constituted by the upper wiring layer.

Figure 11:
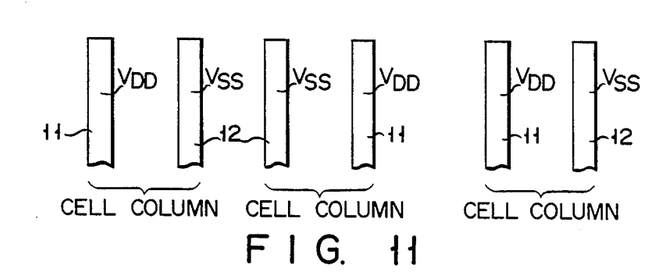
FIG. 11 is a modification of the power source wiring layer connected to the cell block shown in FIG. 3.

The power source wiring layers of the cell block do not necessarily have to be arranged as shown in the embodiment wherein VDD wiring layers 11 and VSS wiring layers 12 are alternately arranged. For example, it is possible to interchange VDD wiring layer 11 and VSS wiring layer 12 in some cell column areas, as is shown in FIG. 11. In this case, it is then necessary to change the power connection wiring pattern, in accordance with such interchange of VDD and VSS wiring layers.

What is claimed is:

1. A semiconductor integrated circuit comprising:
   a functional block including a plurality of first and second power source wiring layers arranged substantially parallel to one another and formed to extend in a predetermined direction, a plurality of element regions each located between adjacent pairs of said first and second power source wiring layers, and a third power source wiring layer structure having upper and lower layers respectively connected to said first and second power source wiring layers;
   a cell block including a plurality of cell column areas each having fourth and fifth power source wiring layers arranged parallel to each other and formed to extend in said predetermined direction, an element region located between said fourth and fifth power source wiring layers, and a plurality of wiring regions, each located between adjacent cell column areas; and
   first and second interconnection members formed to extend in said predetermined direction, to connect said lower and upper layers of said third power source wiring layer structure to said fourth and fifth power source wiring layers.

2. A semicondcutor integrated circuit according to claim 1, wherein said first power source wiring layers are formed integrally with the lower layer of said third power source wiring layer, and each of said second power source wiring layers has a first segment formed in substantially the same plane as said first power source wiring layers and a second segment formed integrally with the upper layer of said third power source wiring layer and electrically connected to said first segment.

3. A semiconductor integrated circuit according to claim 1, wherein said lower layer of said third power source wiring layer structure has first and second lower layer segments which are respectively connected to both ends of said first power source wiring layers and extend in a direction perpendicular to said predetermined direction.

4. A semiconductor integrated circuit according to claim 1, wherein said lower layer of third power source wiring layer structure has a first lower layer segment which is respectively connected to one end of each of said first power source wiring layers and extends in a direction perpendicular to said predetermined direction, and a second lower layer segment which is respectively connected to one end of each of said second power source wiring layers and extends parallel to said first lower layer segment.

5. A semiconductor integrated circuit according to claim 1, further comprising sixth and seventh power source wriing layers extending in a direction perpendicular to said prdetermined direction, said sixth wiring layers being formed integrally with at least one of said first powre source wiring layers, and said seventh power source wiring layer bieng formed to be electrically connected to at least one of said second power source wiring layers.

6. A semiconductor integrated circuit according to claim 5, wherein said lower layer of said third power source wiring layer structure is formed integrally with said sixth powr source wiring layers, and said upper layer of said third power source wiring layer structure is electrically connected to said seventh power source wiring layers.

* * * * *

UNITED STATES PATENT AND TRADEMARK OFFICE
CERTIFICATE OF CORRECTION

PATENT NO. : 4,947,229

DATED : August 7, 1990

INVENTOR(S) : Yutaka Tanaka et al.

It is certified that error appears in the above-identified patent and that said Letters Patent is hereby corrected as shown below:

In the Abstract, line 2, change "or" to --of--.

Column 1, line 35, insert --,-- after"71".

Column 1, line 37, insert --.-- after "74".

Column 2, line 36, delete [aforementioned].

Col. 6, line 44, change "wriing" to --wiring--.

UNITED STATES PATENT AND TRADEMARK OFFICE
CERTIFICATE OF CORRECTION

PATENT NO. : 4,947,229

DATED : August 7, 1990

INVENTOR(S) : Yutaka Tanaka et al

It is certified that error appears in the above-identified patent and that said Letters Patent is hereby corrected as shown below:

Claim 5, column 6, line 45, change "prdetermined" to --predetermined--.

Column 6, line 47, change "powre" to --power--.

Signed and Sealed this

Eleventh Day of May, 1993

Attest:

MICHAEL K. KIRK

Attesting Officer

Acting Commissioner of Patents and Trademarks